(12) United States Patent
Kim et al.

(10) Patent No.: US 10,991,865 B2
(45) Date of Patent: Apr. 27, 2021

(54) DISPLAY DEVICE

(71) Applicant: SAMSUNG DISPLAY CO., LTD., Yongin-si (KR)

(72) Inventors: Kyung Bae Kim, Yongin-si (KR); Min Jae Jeong, Yongin-si (KR); Chong Chul Chai, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 39 days.

(21) Appl. No.: 16/548,226

(22) Filed: Aug. 22, 2019

(65) Prior Publication Data

US 2020/0203587 A1 Jun. 25, 2020

(30) Foreign Application Priority Data

Dec. 20, 2018 (KR) .......................... 10-2018-0166357

(51) Int. Cl.
*H01L 33/62* (2010.01)
*H01L 27/15* (2006.01)

(52) U.S. Cl.
CPC ............ *H01L 33/62* (2013.01); *H01L 27/156* (2013.01)

(58) Field of Classification Search
CPC .............................. H01L 33/62; H01L 27/156
See application file for complete search history.

(56) References Cited

U.S. PATENT DOCUMENTS

| 9,329,433 | B2* | 5/2016 | Negishi | ................ H01L 25/0753 |
| 10,008,645 | B2 | 6/2018 | Bonar et al. | |
| 2018/0019369 | A1* | 1/2018 | Cho | ..................... H01L 25/0753 |
| 2018/0175104 | A1* | 6/2018 | Kang | .................... H01L 33/405 |

FOREIGN PATENT DOCUMENTS

| KR | 10-2017-0084139 A | 7/2017 |
| KR | 10-2017-0094930 A | 8/2017 |

* cited by examiner

*Primary Examiner* — Peniel M Gumedzoe
(74) *Attorney, Agent, or Firm* — Kile Park Reed & Houtteman PLLC

(57) ABSTRACT

A display device includes a substrate including a plurality of pixels; an electrode part including a first electrode in each pixel of the plurality of pixels on the substrate and a second electrode spaced apart from the first electrode on a same plane; a plurality of light emitting devices spaced apart from each other between the first electrode and the second electrode; a power line part including a first power line between the substrate and the first electrode, the first power line to receive a first driving power source, and a second power line between the substrate and the second electrode, the second power line to receive a second driving power source; and a shielding electrode line between the power line part and the first electrode, the shielding electrode line to receive the first driving power source.

19 Claims, 10 Drawing Sheets

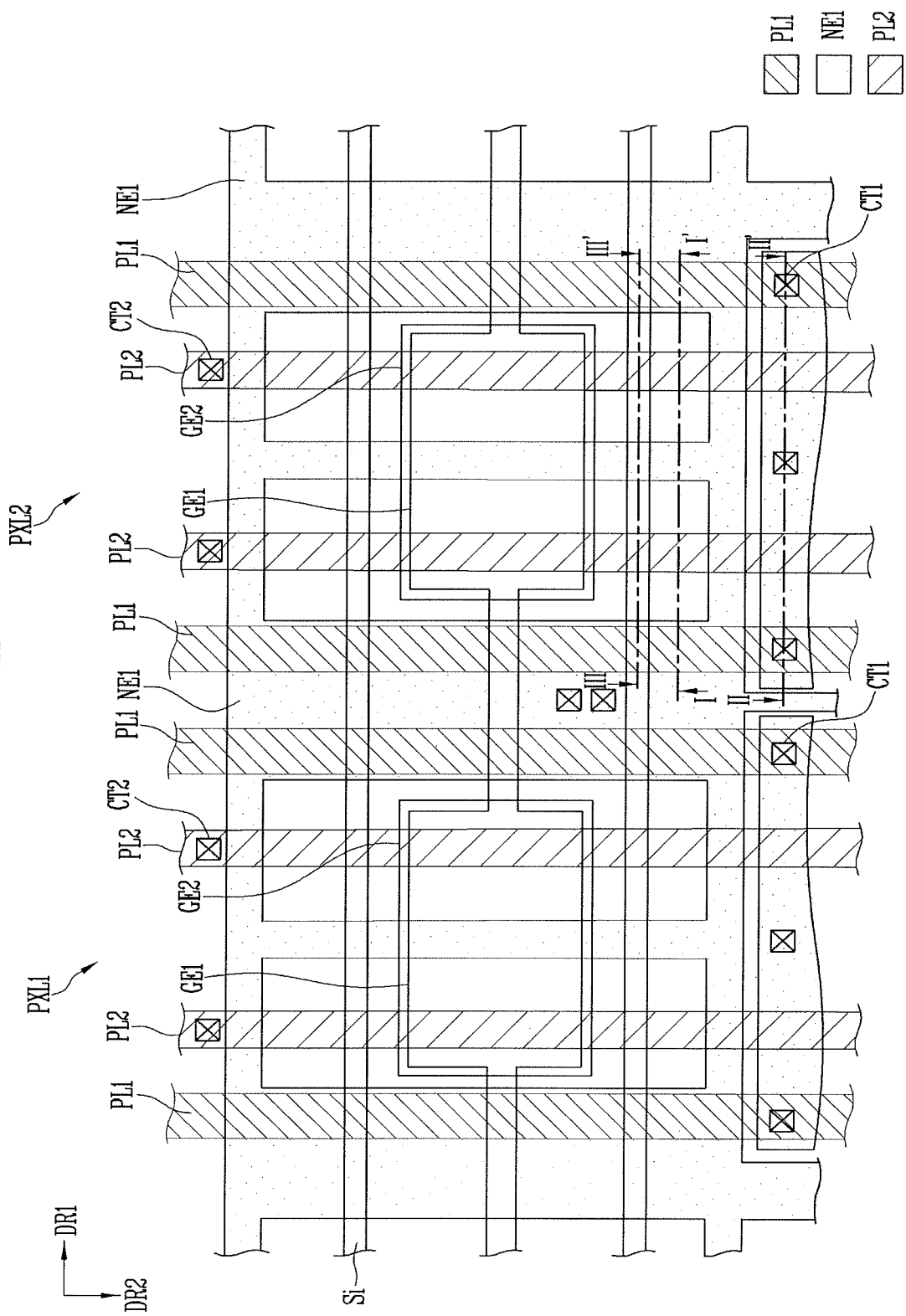

DISPLAY DEVICE

CROSS-REFERENCE TO RELATED APPLICATION

Korean Patent Application No. 10-2018-0166357, filed on Dec. 20, 2018, in the Korean Intellectual Property Office, and entitled: "Display Device," is incorporated by reference herein in its entirety.

BACKGROUND

1. Field

Embodiments relate to a display device including light emitting devices.

2. Description of the Related Art

Light emitting diodes (LEDs) have a high light conversion efficiency, a low power consumption, a semi-permanent lifespan, and an eco-friendliness. When the LEDs are used in a lamp, a flashlight, a display, and the like, it is necessary to arrange the LEDs to form an electrical connection between the LEDs and electrodes for supplying power to the LEDs.

An arrangement method of the LEDs and the electrodes may include a method of directly growing the LEDs on the electrodes and a method of separately growing the LEDs and then disposing the LEDs on the electrodes. In the latter method, when ultra-small LEDs having a nano unit size is disposed on the electrodes, misalignment of the ultra-small LEDs may occur due to a field effect caused by other elements.

SUMMARY

Embodiments are directed to a display device may include a substrate including a plurality of pixels; an electrode part including a first electrode disposed in each pixel of the plurality of pixels on the substrate and a second electrode spaced apart from the first electrode on a same plane; a plurality of light emitting devices spaced apart from each other between the first electrode and the second electrode; a power line part including a first power line between the substrate and the first electrode, the first power line to receive a first driving power source, and a second power line between the substrate and the second electrode, the second power line to receive a second driving power source; and a shielding electrode line between the power line part and the first electrode, the shielding electrode line to receive the first driving power source.

The shielding electrode line may be between the power line part and the first electrode to prevent a vertical electric field effect caused by a driving circuit under the electrode part when the plurality of light emitting devices are aligned between the first electrode and the second electrode.

The first electrode may be an anode electrode of each light emitting device, and the second electrode may be a cathode electrode of each light emitting device.

The first driving power source may correspond to a voltage for supplying a current to one of the first electrode and the second electrode, and the second driving power source may be applied to another one of the first electrode and the second electrode.

The first electrode may be connected to the first driving power source via the driving circuit, and the second electrode may be connected to the second driving power source.

The display device may include a scan line between the substrate and the power line part, the scan line connecting the plurality of light emitting devices and the driving circuit. The scan line may be under the shielding electrode line.

The driving circuit may include at least one transistor. The at least one transistor may include: a semiconductor layer on the substrate, the semiconductor layer having a channel, a source electrode, and a drain electrode; and a gate electrode on the semiconductor layer.

The gate electrode may include: a first gate electrode on a gate insulating layer that is interposed between the first gate electrode and the semiconductor layer; and a second gate electrode between the first gate electrode and the power line part.

The shielding electrode line may be between the power line part and the electrode part.

The shielding electrode line may extend to cover a region between adjacent pixels.

The first electrode may include a first stem part extending in a first direction and a plurality of first branch parts extending from the first stem part in a second direction intersecting the first direction, and the second electrode includes a second stem part extending in the first direction, and a plurality of second branch parts extending from the second stem part in the second direction, the plurality of second branch parts being alternately disposed with the plurality of first branch parts.

The shielding electrode line may overlap at least one of the first branch parts of the first electrode or the second branch parts of the second electrode.

One of the plurality of first branch parts of the first electrode may be at an outermost portion of each pixel. The shielding electrode line may overlap the one of the plurality of first branch parts of the first electrode at the outermost portion of each pixel, and extends to cover a region between adjacent pixels.

The shielding electrode line may be connected to the first power line through a contact hole.

The shielding electrode line and the second power line may not overlap each other in each pixel.

The shielding electrode line may include: a first electrode part extending in a first direction; and a second electrode part extending in a second direction perpendicular to the first direction.

Embodiments is directed to a display device including: a substrate including a plurality of pixels; an electrode part including a first electrode in each pixel of the plurality of pixels on the substrate and a second electrode spaced apart from the first electrode on a same plane; a plurality of light emitting devices spaced apart from each other between the first electrode and the second electrode; a power line part including a first power line between the substrate and the first electrode, the first power line having a first driving power source applied thereto, and a second power line between the substrate and the second electrode, the second power line having a second driving power source applied thereto; and a shielding electrode line between the power line part and the first electrode, the shielding electrode line having the first driving power source applied thereto, wherein: the first electrode may include a first stem part extending in a first direction and a plurality of first branch parts extending from the first stem part in a second direction intersecting the first direction, and the second electrode may include a second stem part extending in the first direction, and a plurality of second branch parts extending from the second stem part in the second direction, the plurality of second branch parts being alternately disposed with the plurality of first branch parts, and wherein the shielding electrode line may include a third stem part extending in the first direction and a plurality of third branch parts extending from the third stem part in the second direction.

At least some of the third branch parts may overlap at least one of the first branch parts or the second branch parts.

One of the plurality of first branch parts may be at an outermost portion of each pixel. One of the third branch parts may overlap the one of the plurality of first branch parts at the outermost portion of each pixel, and extends to cover a region between adjacent pixels.

BRIEF DESCRIPTION OF THE DRAWINGS

Features will become apparent to those of skill in the art by describing in detail exemplary embodiments with reference to the attached drawings in which:

FIGS. 5A and 5B illustrate plan views of region EA1 in FIG. 2.

DETAILED DESCRIPTION

Figure 1:
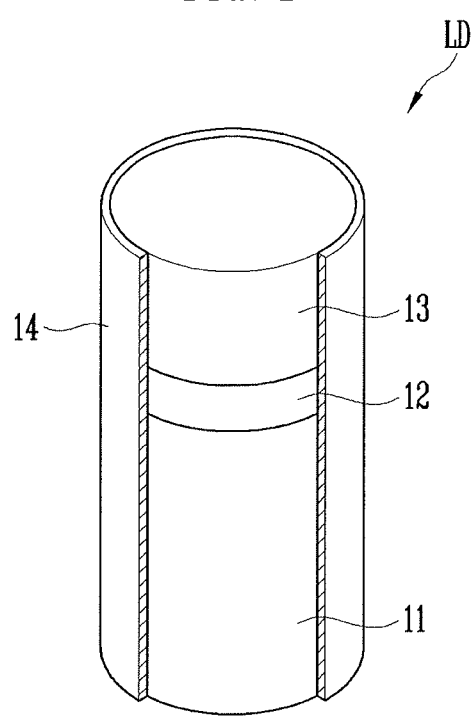
FIG. 1 illustrates a perspective view of a light emitting device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The present disclosure may apply various changes and different shape, therefore only illustrate in details with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, exemplary embodiments will be described in more detail with reference to the accompanying drawings.

FIG. 1 illustrates a perspective view of a light emitting device according to an exemplary embodiment. The light emitting device LD may be a light emitting diode (LED) having a small size (e.g., a nano unit size). The size of the light emitting device LD may be varied and modified according to kinds of display devices, to which the light emitting device LD is applied.

The light emitting device LD may be formed in various shapes, e.g., a cylindrical column shape, a rectangular parallelepiped shape, and a polygonal column shape. As illustrated in FIG. 1, the light emitting device LD may have a cylindrical column shape. For example, the light emitting device LD may have a bar shape extending in one direction. The bar shape may include a rod-like shape or bar-like shape, which is long in a length direction. For example, the light emitting device LD may have a length greater than a diameter thereof.

The light emitting device LD may be used as a light emitting source in various display devices. For example, the light emitting device LD may be used for lighting devices or self-luminescent display devices, and may emit a light including, e.g., a red light, a green light, a blue light, or a white light.

Referring to FIG. 1, the light emitting device LD, according to an exemplary embodiment, may include a first conductive semiconductor layer 11, a second conductive semiconductor layer 13, and an active layer 12 interposed between the first and second conductive semiconductor layers 11 and 13. For example, the light emitting device LD may be implemented in a stack structure, in which the first conductive semiconductor layer 11, the active layer 12, and the second conductive semiconductor layer 13 are sequentially stacked.

For example, when the light emitting device LD extends in a length direction, the light emitting device LD may have one end portion and an opposite end portion along the length direction. One of the first and second conductive semiconductor layers 11 and 13 may be disposed at the one end portion of the light emitting device LD, and another one of the first and second conductive semiconductor layers 11 and 13 may be disposed at the opposite end portion of the light emitting device LD.

The first conductive semiconductor layer 11 may include, for example, at least one n-type semiconductor layer. For example, the first conductive semiconductor layer 11 may include at least one semiconductor material among, e.g., InAlGaN, GaN, AlGaN, InGaN, AlN, and InN, and may include a semiconductor layer that is doped with a first conductive dopant, e.g., Si, Ge or Sn. For example, the first conductive semiconductor layer 11 may be formed of various materials.

The active layer 12 may be formed on the first conductive semiconductor layer 11, and may be formed in a single or multiple quantum well structure. In an exemplary embodiment, a clad layer, which is doped with a conductive dopant, may be formed on a top surface and/or a bottom surface of the active layer 12. For example, the clad layer may be formed of, e.g., an AlGaN layer or InAlGaN layer. Further, AlGaN or AlInGaN may also be used to form the active layer 12. When an electric field having a predetermined voltage or more is applied to both ends of the light emitting device LD, the light emitting device LD may emit light by combinations between electron-hole pairs in the active layer 12.

The second conductive semiconductor layer 13 may be formed on the active layer 12, and may include a semiconductor layer having a different type from the first conductive semiconductor layer 11. For example, the second conductive semiconductor layer 13 may include at least one p-type semiconductor layer. For example, the second conductive semiconductor layer 13 may include at least one semiconductor material among, e.g., InAlGaN, GaN, AlGaN, InGaN, AlN, and InN, and may include a semiconductor layer doped with a second conductive dopant, e.g., Mg. For example, the second conductive semiconductor layer 13 may be formed of various materials.

In an exemplary embodiment, the light emitting device LD may further include additional phosphor layer, active layer, semiconductor layer, and/or electrode layer on top surfaces and/or bottom surfaces of the first conductive semiconductor layer 11, the active layer 12, and the second conductive semiconductor layer 13.

In some embodiments, the light emitting device LD may further include an electrode layer on the top surface of the second conductive semiconductor layer 13. The electrode layer may include, e.g., a metal or metal oxide. For example, the electrode layer may be formed of one or mixture of, e.g., chromium (Cr), titanium (Ti), aluminum (Al), gold (Au), nickel (Ni), ITO, and oxide or alloy thereof.

For example, the light emitting device LD may further include an insulative film 14. In an exemplary embodiment, the insulative film 14 may be omitted. In another exemplary embodiment, the insulative film 14 may partially cover the first conductive semiconductor layer 11, the active layer 12, and the second conductive semiconductor layer 13.

For example, the insulative film 14 may entirely cover the first conductive semiconductor layer 11, the active layer 12, and the second conductive semiconductor layer 13 except both end portions of the light emitting device LD, so that the both end portions of the light emitting device LD may be exposed. For example, a side surface of a cylindrical column of the light emitting device LD may be entirely surrounded by the insulative film 14. For example, the insulative film 14 may surround at least a portion of outer circumferential surfaces of the first conductive semiconductor layer 11, the active layer 12, and/or the second conductive semiconductor layer 13. For example, the insulative film 14 may surround only an outer circumferential surface of the active layer 12.

In an exemplary embodiment, the insulative film 14 may include a transparent insulating material. For example, the insulative film 14 may include at least one insulating material selected from the group consisting of, e.g., $SiO_2$, $Si_3N_4$, $Al_2O_3$, and $TiO_2$. Further, the insulative film 14 may be formed of various materials.

When the insulative film 14 is provided in the light emitting device LD, a short-circuit caused by the active layer 12 contacting conductive materials other than the first conductive semiconductor layer 11 and the active layer 12 may be prevented. Further, when the insulative film 14 is formed, a surface defect of the light emitting device LD may be minimized, so that a lifespan and an efficiency of the light emitting device LD may be improved. Furthermore, when a plurality of light emitting devices LD are densely disposed, the insulative film 14 may prevent an unwanted short circuit between the light emitting devices LD.

Figure 2:
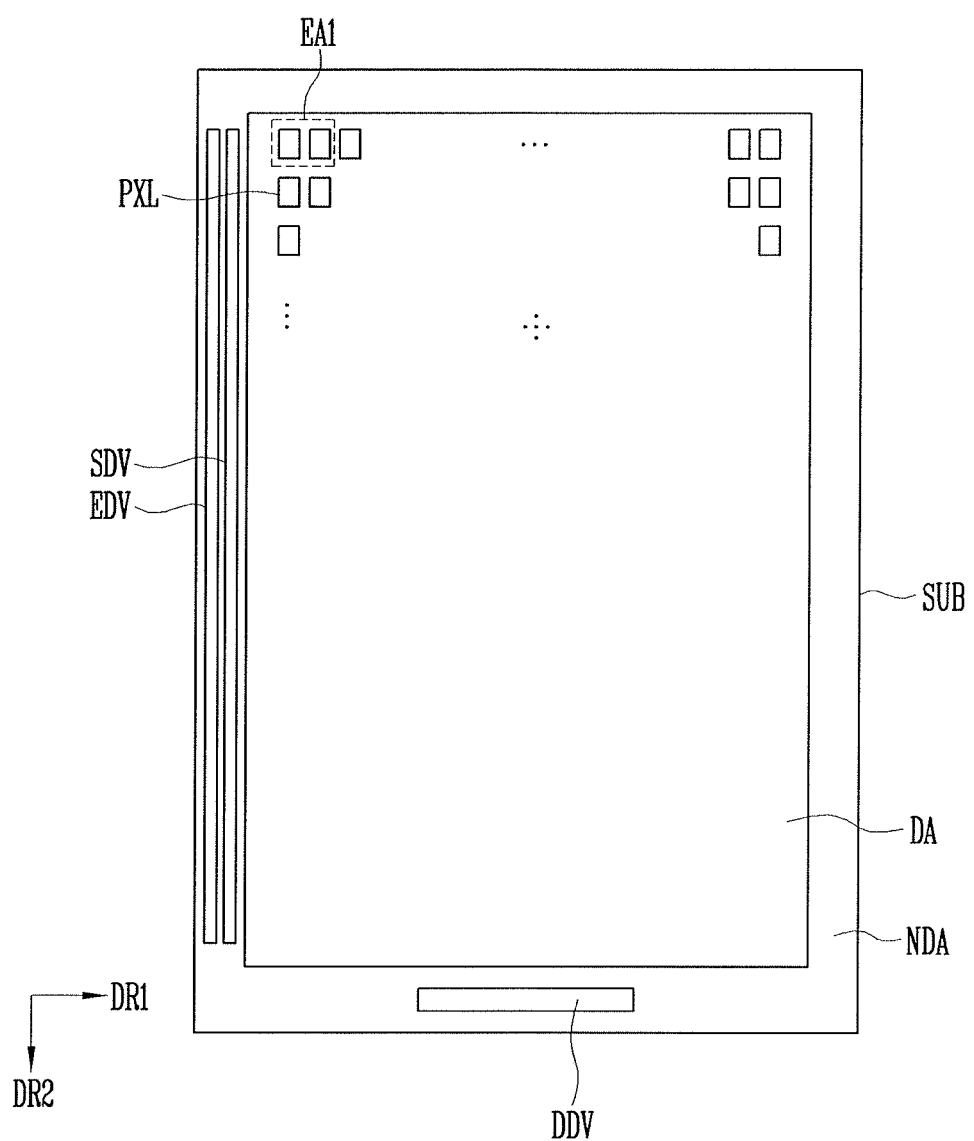
FIG. 2 illustrates a schematic plan view of a display device with a light emitting source (e.g., the light emitting device in FIG. 1) according to an exemplary embodiment.

FIG. 2 illustrates a schematic plan view of a display device with a light emitting source (e.g., the light emitting device in FIG. 1) according to an exemplary embodiment. Referring to FIG. 2, the display device according to the exemplary embodiment may include a substrate SUB, a plurality of pixels PXL on the substrate SUB, a driving unit, and a line unit that connects the pixels PXL and the driving unit. The driving unit may be provided on the substrate SUB and may drive the pixels PXL.

The substrate SUB may include a display region DA and a non-display region NDA. The display region DA may be a region in which the pixels PXL are provided. For example, the pixels PXL may display an image. The non-display region NDA may be a region in which the driving unit and the line unit are provided. For example, the driving unit may drive the pixels PXL. The line unit may connect the pixels PXL to the driving unit.

The display region DA may have various shapes. For example, the display region DA may be formed in, e.g., a closed polygon, a circle, an ellipse, a semicircle, or a semi-ellipse, which include linear sides and/or curved sides. When the display region DA includes a plurality of regions, each region may also be provided in various shapes, e.g., a closed polygon, a circle, an ellipse, a semicircle, or a semi-ellipse, which include linear sides and/or curved sides. In addition, the plurality of regions may have the same area or different areas.

In an exemplary embodiment, the display region DA may have a quadrangular shape including linear sides. The non-display region NDA may be provided at one side of the display region DA. In an exemplary embodiment, the non-display region NDA may surround the circumference of the display region DA.

The pixels PXL may be provided in the display region DA on the substrate SUB. Each of the pixels PXL may be a minimum unit for displaying an image. Each of the pixels PXL may include a light emitting device that emits white light and/or colored light. For example, each pixel PXL may emit light of at least one color among red, green, and blue.

For example, the pixel PXL may emit light of at least one color among cyan, magenta, yellow, and white.

The pixels PXL may be arranged in a matrix form along rows extending in a first direction DR1 and columns extending in a second direction DR2 intersecting the first direction DR1. For example, the pixels PXL may be arranged in various forms.

The driving unit may provide a signal to each pixel PXL through the line unit, and the driving of the pixel PXL may be controlled. In FIG. 2, the line unit is omitted for convenience of description.

The driving unit may include a scan driver SDV for providing a scan signal to the pixels PXL through scan lines, an emission driver EDV for providing an emission control signal to the pixels PXL through emission control lines, a data driver DDV for providing a data signal to the pixels PXL through data lines, and a timing controller. The timing controller may control the scan driver SDV, the emission driver EDV, and the data driver DDV.

Figure 3A:
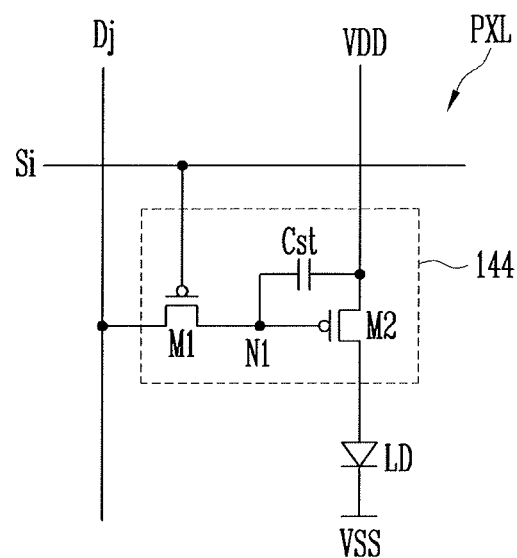
FIGS. 3A and 3B illustrate pixels in FIG. 2 according to an exemplary embodiment.
Figure 3B:
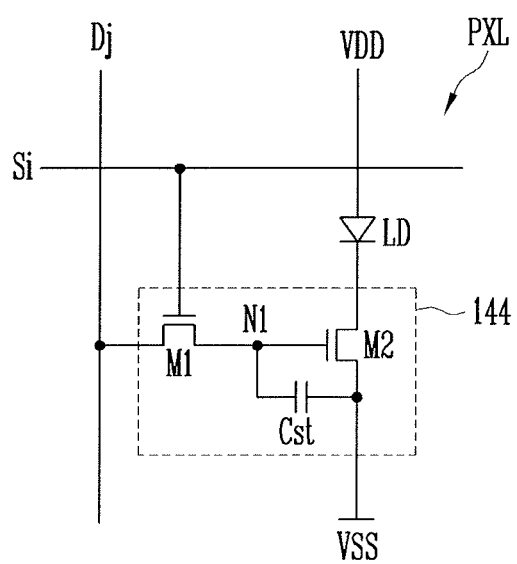

FIGS. 3A and 3B illustrate pixels in FIG. 2. For example, the pixels in FIGS. 3A and 3B may constitute an active light emitting display panel. As illustrated in FIGS. 3A and 3B, each pixel PXL may be connected to a jth data line Dj, an (i−1)th scan line Si−1, an ith scan line Si, and an (i+1)th scan line Si+1.

Referring to FIG. 3A, the pixel PXL may include at least one light emitting device LD and a driving circuit 144 for driving the light emitting device LD. An one end portion of the light emitting device LD (e.g., an anode electrode of a light emitting unit including at least one light emitting device or an anode electrode of a pixel) may be connected to a first driving power source VDD via the driving circuit 144, and an opposite end portion of the light emitting device LD (e.g., a cathode electrode of a light emitting unit including at least one light emitting device or a cathode electrode of a pixel) may be connected to a second driving power source VSS. In exemplary embodiments, the first driving power source VDD may correspond to a voltage for supplying current to the one end portion of the light emitting device LD, and the second driving power source VSS may be applied to the opposite end portion of the light emitting device LD. Alternatively, the second driving power source VSS may correspond to a voltage for supplying current to the first electrode of the light emitting device LD, and the first driving power source VDD may be applied to the second electrode of the light emitting device LD.

The first driving power source VDD and the second driving power source VSS may have different potentials. For example, the second driving power source VSS may have a potential lower by a threshold voltage or more of the light emitting device LD than that of the first driving power source VDD. The light emitting device LD may emit light with a luminance corresponding to a driving current controlled by the driving circuit 144.

For example, the pixel in FIG. 3A may have only one light emitting device LD. For example, the pixel PXL may include a plurality of light emitting devices LD connected in parallel to each other.

In an exemplary embodiment, the driving circuit 144 may include first and second transistors M1 and M2 and a storage capacitor Cst. Further, the structure of the driving circuit 144 may be changeable.

A first electrode of the first transistor M1 (as a switching transistor) may be connected to a data line Dj. A second electrode of the first transistor M1 may be connected to a first node N1. The first electrode and the second electrode of the first transistor M1 may be different electrodes. For example, the first electrode of the first transistor M1 is a source electrode, and the second electrode of the first transistor M1 may be a drain electrode. In addition, a gate electrode of the first transistor M1 may be connected to a scan line Si.

The first transistor M1 may be turned on when a turn-on voltage (e.g., a low voltage) is supplied to the gate electrode of the first transistor M1 through the scan line Si. When the first transistor M1 is turned on, the data line Dj and the first node N1 may be electrically connected to each other. A data signal of a corresponding frame may be supplied to the data line Dj. Thus, the data signal may be transferred to the first node N1 through the first transistor M1 that is turned on. The data signal transferred to the first node N1 may be charged in the storage capacitor Cst.

A first electrode of the second transistor M2 (as a driving transistor) may be connected to the first driving voltage VDD. A second electrode of the second transistor M2 may be connected to the first electrode of the light emitting device LD. In addition, a gate electrode of the second transistor M2 may be connected to the first node N1. The second transistor M2 may supply an amount of driving current corresponding to a voltage of the first node N1 to the light emitting device LD.

One electrode of the storage capacitor Cst may be connected to the first driving power source VDD. Another electrode of the storage capacitor Cst may be connected to the first node N1. The storage capacitor Cst may charge a voltage corresponding to the data signal supplied to the first node N1, and may maintain the charged voltage until a data signal of a next frame is supplied thereto.

FIG. 3A illustrates the driving circuit 144 having a simple structure, which includes the first transistor M1 for transferring the data signal to the inside of the pixel PXL, the storage capacitor Cst for storing the data signal, and the second transistor M2 for supplying a driving current corresponding to the data signal to the light emitting device LD. In some embodiments, the structure of the driving circuit 144 may be variously modified and implemented.

For example, the driving circuit 144 may include at least one transistor, e.g., a compensation transistor for compensating for a threshold voltage of the second transistor M2, an initializing transistor for initializing the first node N1, and/or an emission control transistor for controlling a light emitting time of the light emitting device LD. Alternatively, the driving circuit 144 may further include other circuit elements, e.g., a boosting capacitor for boosting a voltage of the first node N1.

As illustrated in FIG. 3A, both the transistors, e.g., the first and second transistors M1 and M2 included in the driving circuit 144, may be implemented with a P-type transistor. Alternatively, at least one of the first and second transistors M1 and M2 included in the driving circuit 144 may be implemented with an N-type transistor.

Referring to FIG. 3B, in an exemplary embodiment, the first and second transistors M1 and M2 may be implemented with an N-type transistor. The configuration and operation of a driving circuit 144 in FIG. 3B are similar to those of the driving circuit 144 in FIG. 3A, except that connections between some components are changed by using the N-type transistors rather than the P-type transistors. Thus, a detailed description of this will be omitted.

Figure 4:
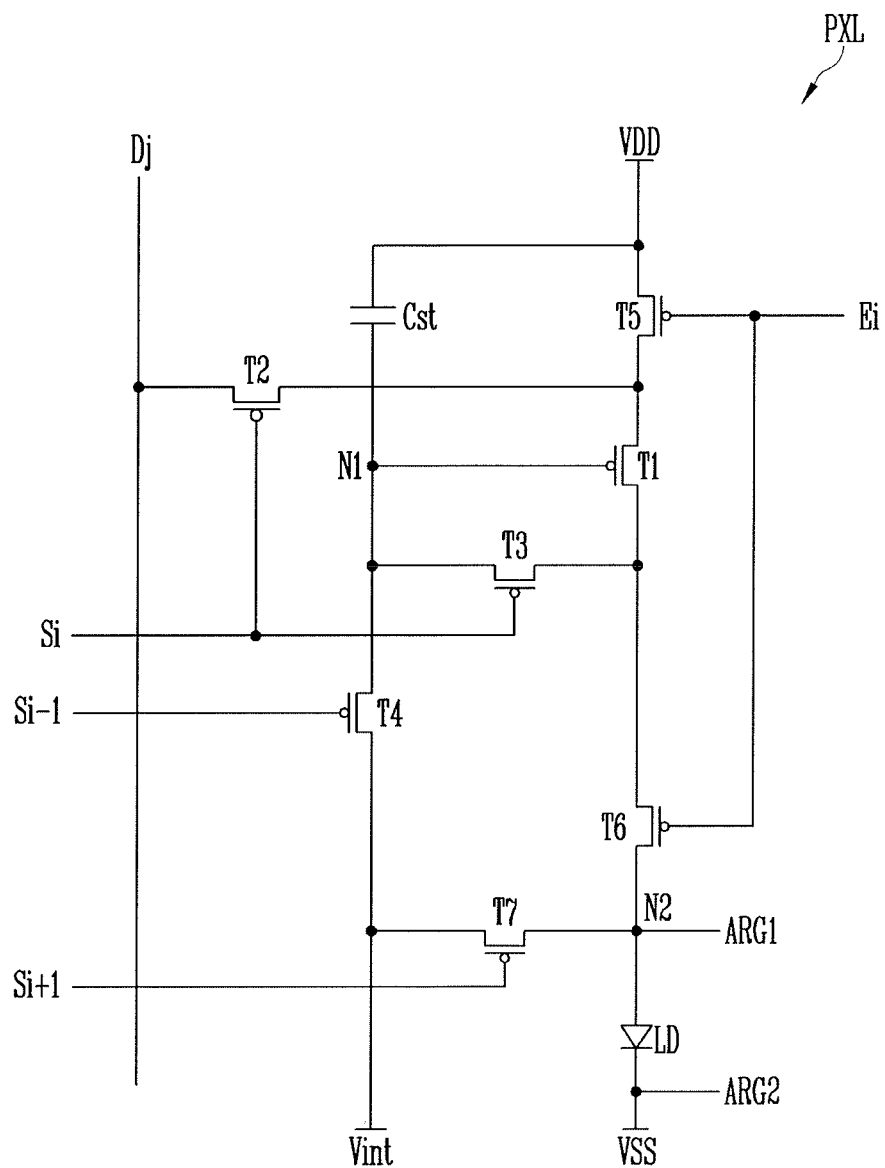
FIG. 4 illustrates a pixel in FIG. 2 according to another exemplary embodiment.

FIG. 4 illustrates one pixel among the pixels shown in FIG. 2 according to another embodiment. For example, a pixel PXL in FIG. 4 may be connected to a jth data line Dj, an (i−1)th scan line Si−1, an ith scan line Si, and an (i+1)th scan line Si+1.

Referring to FIG. 4, the pixel PXL may include a light emitting device LD, first to seventh transistors T1 to T7, and a storage capacitor Cst. An one end portion of the light emitting device LD (e.g., an anode electrode of a light emitting unit including at least one light emitting device or an anode electrode of a pixel) may be connected to the first transistor T1 via the sixth transistor T6. An opposite end portion of the light emitting device LD (e.g., a cathode electrode of a light emitting unit including at least one light emitting device or a cathode electrode of a pixel) may be connected to a second driving power source VSS. For example, one end portion of the light emitting device LD may be connected to the first transistor T1 via the sixth transistor T6, and another end portion of the light emitting device LD may be connected to a second driving power source VSS. The light emitting device LD may generate light with a predetermined luminance corresponding to an amount of current supplied through the first transistor T1.

A source electrode of the first transistor T1 (as a driving transistor) may be connected to a first driving power source VDD via the fifth transistor 15. A drain electrode of the first transistor T1 may be connected to the first electrode (or the one end portion) of the light emitting device LD via the sixth transistor T6. The first transistor T1 may control an amount of current flowing from the first driving power source VDD to the second driving power source VSS via the light emitting device LD, according to a voltage of a first node N1 that is connected to a gate electrode of the first transistor T1.

The second transistor T2 (as a switching transistor) may be connected between a jth data line Dj and the source electrode of the first transistor T1. In addition, a gate electrode of the second transistor T2 may be connected to an ith scan line Si. The second transistor T2 may be turned on when a scan signal is supplied to the ith scan line Si. The jth data line Dj and the source electrode of the first transistor T1 may be electrically connected to each other through the second transistor T2 that is turned on.

The third transistor T3 may be connected between the drain electrode of the first transistor T1 and the gate electrode of the first transistor T1 (i.e., the first node N1). In addition, a gate electrode of the third transistor T3 may be connected to the ith scan line Si. The third transistor T3 may be turned on when an ith scan signal is supplied to the ith scan line Si. When the transistor T3 is turned on, the drain electrode of the first transistor T1 and the gate electrode of the first transistor T1 (i.e., the first node N1) may be electrically connected to each other. Thus, the first transistor T1 may be connected in a diode form when the third transistor T3 is turned on.

The fourth transistor T4 may be connected between the first node N1 and an initialization power source Vint. In addition, a gate electrode of the fourth transistor T4 may be connected to an (i−1)th scan line Si−1. The fourth transistor T4 may be turned on when an (i−1)th scan signal is supplied to the (i−1)th scan line Si−1. When the fourth transistor T4 is turned on, the voltage of the initialization power source Vint may be supplied to the first node N1. For example, the initialization power source Vint may be set to a voltage lower than a data signal.

The fifth transistor T5 may be connected between the first driving power source VDD and the source electrode of the first transistor T1. In addition, a gate electrode of the fifth transistor T5 may be connected to an ith emission control line Ei. The fifth transistor T5 may be turned off when an ith emission control signal is supplied to the ith emission control line Ei. The fifth transistor T5 may be turned on when the ith emission control signal is not supplied to the ith emission control line Ei.

The sixth transistor T6 may be connected between the drain electrode of the first transistor T1 and the first electrode (or the one end portion) of the light emitting device LD. In addition, a gate electrode of the sixth transistor T6 may be connected to the ith emission control line Ei. The sixth transistor T6 may be turned off when the ith emission control signal is supplied to the ith emission control line Ei. The sixth transistor T6 may be turned on when the ith emission control signal is not supplied to the ith emission control line Ei.

The seventh transistor T7 may be connected between the initialization power source Vint and the one end portion of the light emitting device LD (or an anode electrode of a pixel). In addition, a gate electrode of the seventh transistor T7 may be connected to an (i+1)th scan line Si+1. The seventh transistor T7 may be turned on when a (i+1)th scan signal is supplied to the (i+1)th scan line Si+1. When the seventh transistor T7 is turned on, the voltage of the initialization power source Vint may be supplied to the one end portion of the light emitting device LD (or an anode electrode of a pixel).

The storage capacitor Cst may be connected between the first driving power source VDD and the first node N1. The storage capacitor Cst may store a voltage corresponding to the data signal and a threshold voltage of the first transistor T1.

For example, when the light emitting device LD may be aligned in the pixel PXL, a first alignment line ARG1 may be connected to the first electrode (i.e., a second node N2), and a second alignment line ARG2 may be connected to the second electrode (or the another end portion) of the light emitting device LD. A ground voltage GND may be applied to the first alignment line ARG1, and an alternative current (AC) voltage may be applied to the second alignment line ARG2. When predetermined voltages having different voltage levels are respectively applied to the first and second alignment lines ARG1 and ARG2, an electric field may be formed between the second node N2 and the opposite end portion of the light emitting device LD (or an cathode electrode of a pixel). The light emitting device LD may be aligned in a desired region in the pixel PXL by the electric field.

As described above, when the light emitting device LD is aligned using the electric field induced between the second node N2 and the second electrode (or the another end portion) of the light emitting device LD, a pixel circuit in the pixel PXL may be driven, and misalignment of the light emitting device LD may occur due to an electric field induced from other elements. For example, in order to prevent the misalignment, there is provided a display device including a shielding electrode line capable of shielding an electric field caused from the pixel circuit. Hereinafter, a detailed structure of the display device according to exemplary embodiments will be described in more detail with reference to FIGS. 5 to 8.

Figure 5B:
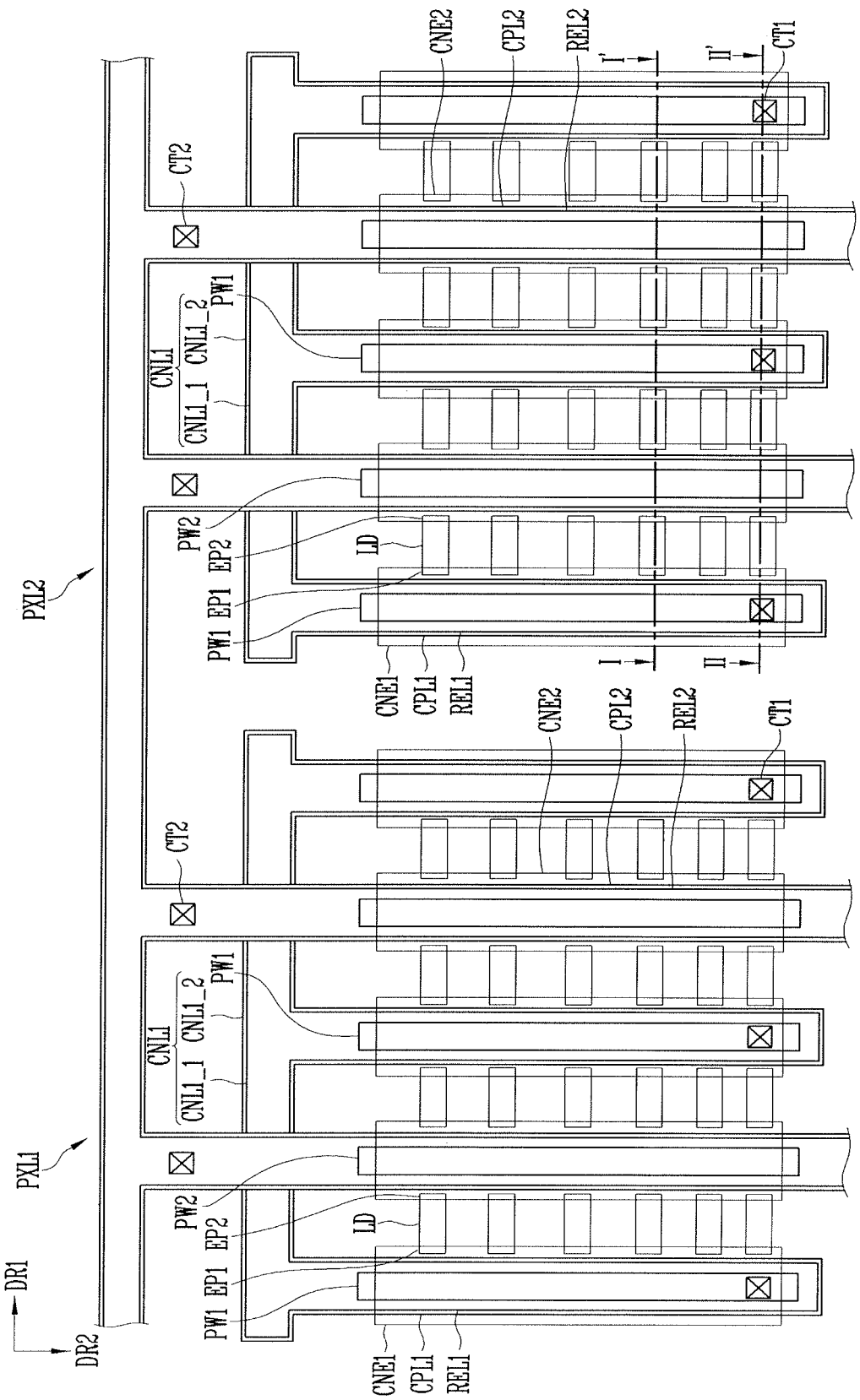
Figure 6A:
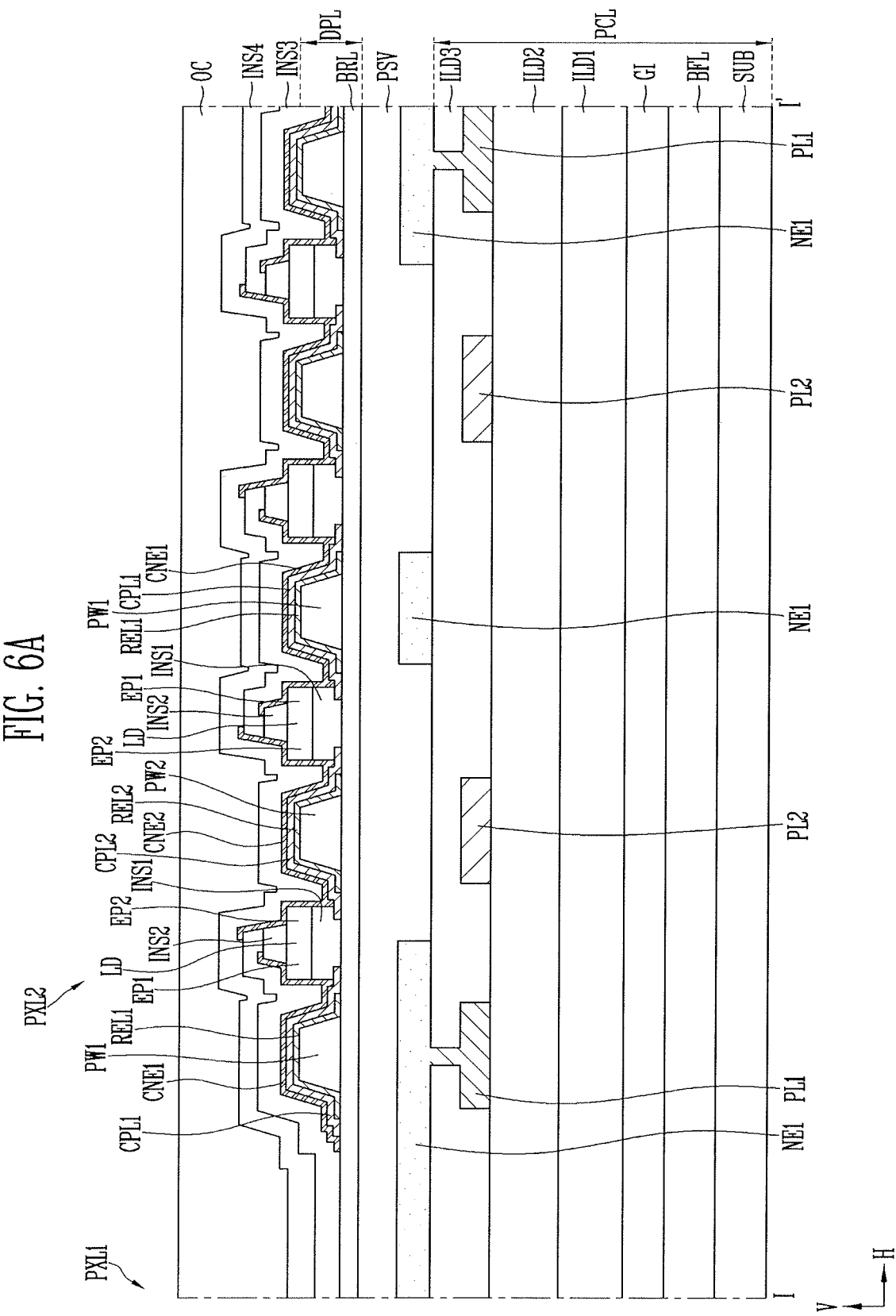
FIG. 6A illustrates a sectional view taken along line I-I' in FIGS. 5A and 5B.
Figure 6B:
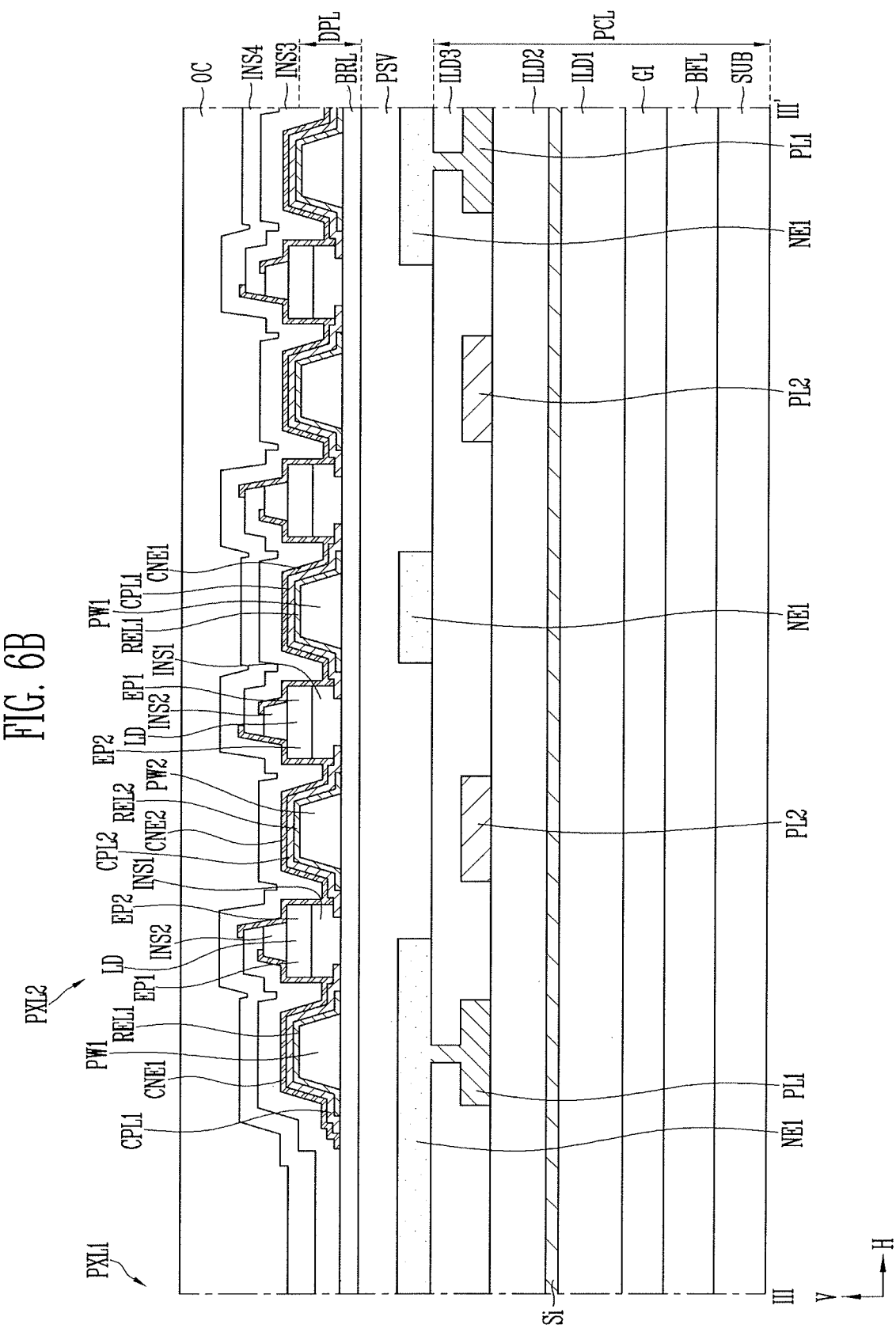
FIG. 6B illustrates a sectional view taken along line III-III' in FIG. 5A.
Figure 7:
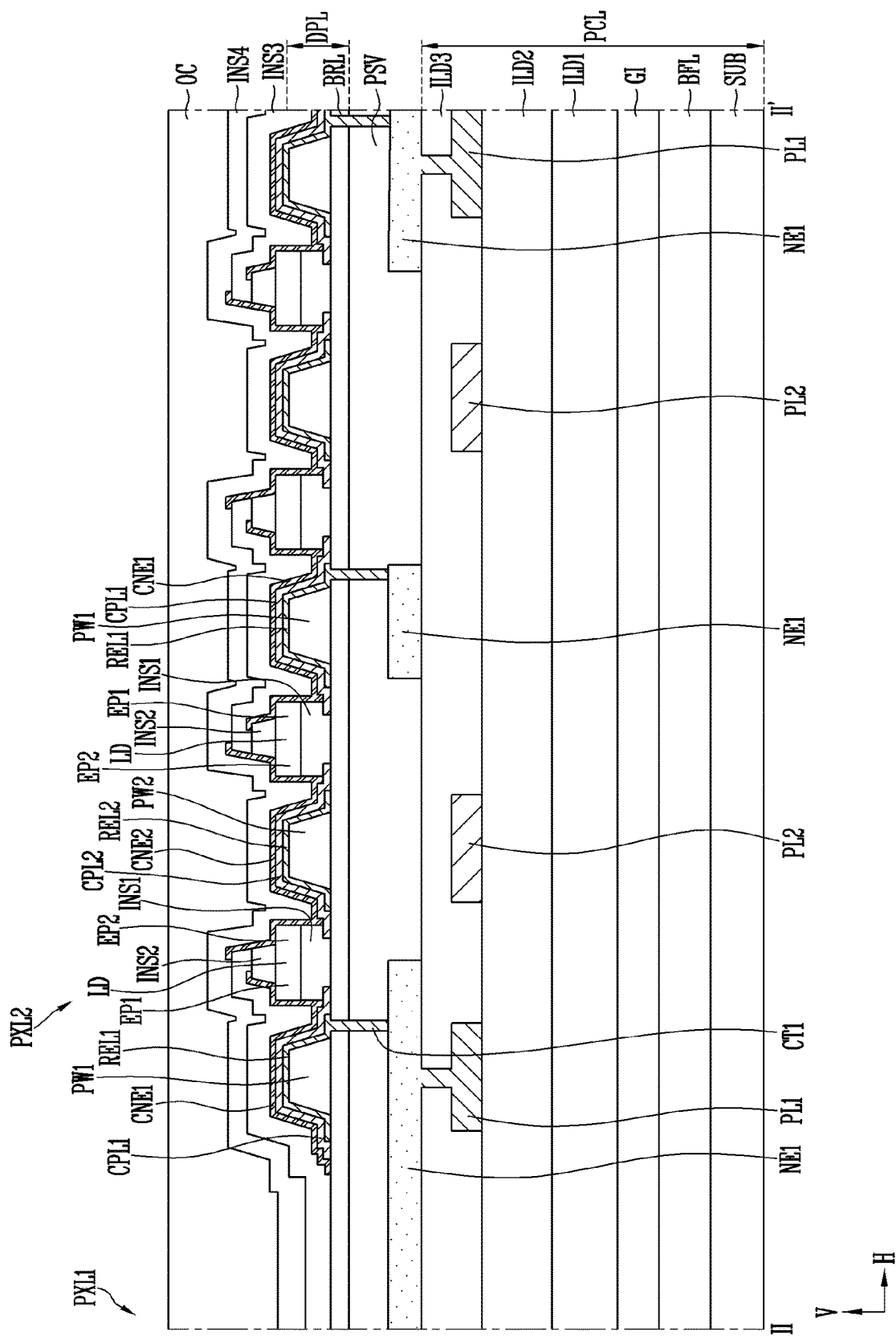
FIG. 7 illustrates a sectional view taken along line II-II' in FIGS. 5A and 5B.
Figure 8:
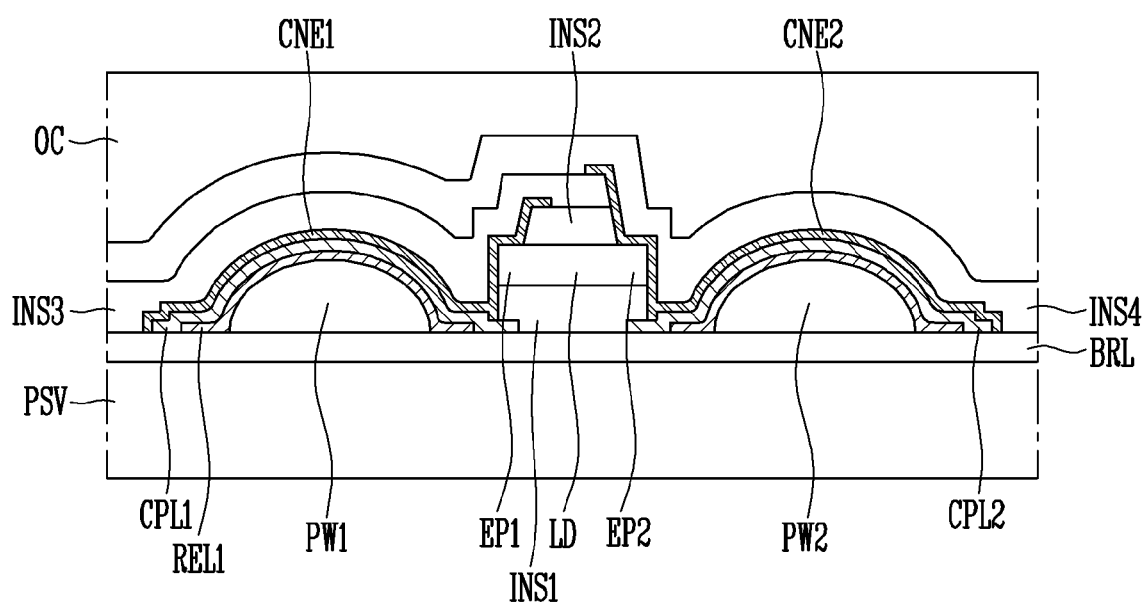
FIG. 8 illustrates a sectional view of a display element layer in FIGS. 6A, 6B, and 7 according to an exemplary embodiment.

FIGS. 5A and 5B illustrate plan views of region EA1 in FIG. 2. FIG. 6A illustrates a sectional view taken along line I-I' shown in FIGS. 5A and 5B. FIG. 6B illustrates a sectional view taken along line III-III' shown in FIG. 5A. FIG. 7 illustrates a sectional view taken along line II-II' shown in FIGS. 5A and 5B. FIG. 8 illustrates a sectional view of a display element layer shown in FIGS. 6A, 6B, and 7 according to an exemplary embodiment.

FIG. 5A illustrates a plan view of a pixel circuit layer PCL and a protective layer PSV (see FIGS. 6A, 6B, and 7) in the region EA1, and FIG. 5B illustrates a plan view of a display element layer DPL (see FIGS. 6A, 6B, and 7) on the protective layer PSV in the region EA1.

Referring to FIGS. 5A, 5B, 6A, 6B, and 7, the display device according to an exemplary embodiment may include a substrate SUB on which a first pixel PXL1 and a second pixel PXL2 are provided.

Each of the first and second pixels PXL1 and PXL2 may include the substrate SUB, a pixel circuit layer PCL on the substrate SUB, and a display element layer DPL on the pixel circuit layer PCL. In some embodiments, a protective layer PSV may be further provided between the pixel circuit layer PCL and the display element layer DPL.

The substrate SUB may include an insulating material, e.g., glass, organic polymer, or quartz. For example, the substrate SUB may be made of a material having flexibility to be bendable or foldable. The substrate SUB may have a single-layered structure or a multi-layered structure.

The pixel circuit layer PCL may include a buffer layer BFL on the substrate SUB, a transistor on the buffer layer BFL, and power lines PL1 and PL2.

The buffer layer BFL may prevent an impurity from being diffused into the transistor. The buffer layer BFL may be formed in a single layer. In an exemplary embodiment, the buffer layer BFL may be formed in a multi-layer including at least two layers. When the buffer layer BFL is formed in the multi-layer, the layers may be formed of the same material or be formed of different materials. Alternatively, the buffer layer BFL may be omitted according to materials and process conditions of the substrate SUB.

The transistor may include a driving transistor that drives a light emitting device LD in the display element layer DPL and/or a switching transistor that supplies a data signal to the driving transistor.

A semiconductor layer may be disposed in a gate insulating layer GI on the buffer layer BFL. The semiconductor layer may include a first region in contact with a first electrode of the transistor and a second region in contact with a second electrode of the transistor. A third region between the first region and the second region of the semiconductor layer may be a channel region. In an exemplary embodiment, the first region of the semiconductor layer may be one of a source region and a drain region, and the second region of the semiconductor layer may be another one of the source region and the drain region.

The semiconductor layer may be a semiconductor pattern that is formed of, e.g., poly-silicon, amorphous silicon, oxide semiconductor, etc. The channel region of the semiconductor layer may be a semiconductor pattern that is undoped with an impurity, and may be an intrinsic semiconductor. The first region and the second region of the semiconductor layer may be semiconductor patterns doped with the impurity.

A first gate electrode GE1 may be provided in a first interlayer insulating layer ILD1, and a second gate electrode GE2 may be provided in a second interlayer insulating layer ILD2. The first gate electrode GE1 may be provided on the semiconductor layer, and the second gate electrode GE2 may be provided on the first gate electrode GE1. In an exemplary embodiment, the second gate electrode GE2 may have an area wider than that of the first gate electrode GE1. In an exemplary embodiment, the first gate electrode GE1 and the second gate electrode GE2, which are vertically stacked, may constitute a capacitor, e.g., a storage capacitor Cst.

Referring to FIG. 6B, a scan line Si may be further provided on the first interlayer insulating layer ILD1.

A power line may be provided in a third interlayer insulating layer ILD3. The power line may include a first power line PL1 and a second power line PL2. In some embodiments, the first power line PL1 may be provided under a first reflective electrode REL1. The first reflective electrode REL1 may be an anode electrode of a pixel (or a light emitting unit including a light emitting device LD). For example, the first reflective electrode REL1 may include a first reflective electrode disposed at an outermost portion of a pixel PXL. In some embodiments, the second power line PL2 may be provided under a second reflective electrode REL2. The second reflective electrode REL2 may be a cathode electrode of a pixel (or a light emitting unit including a light emitting device LD). The first power line PL1 and the second power line PL2 do not overlap each other in a horizontal direction H. In some embodiments, a first power source ELVDD may be applied through the first power line PL1, and a second power source ELVSS may be applied through the second power line PL2.

For example, the first and second electrodes of the transistor may be provided on the third interlayer insulating layer ILD3. The first and second electrodes of the transistor may be connected to the first and second regions of the semiconductor layer through contact holes penetrating the first and second interlayer insulating layers ILD1 and ILD2 and the gate insulating layer GI. The first electrode may be one of source and drain electrodes, and the second electrode may be another one of the source and drain electrodes.

The protective layer PSV may be provided on the third interlayer insulating layer ILD3. The protective layer PSV may be provided to cover a shielding electrode line NE1. In some embodiments, the shielding electrode line NE1 may be provided under the first reflective electrode REL1. In an exemplary embodiment, the first reflective electrode REL1 may be an anode electrode of a pixel (or a light emitting unit).

In an exemplary embodiment, the shielding electrode line NE1 may be provided under the first reflective electrode REL1 that is disposed at the outermost portion of the pixel PXL. The shielding electrode line NE1 under the first reflective electrode REL1 may be connected to the first power line PL1 on the third interlayer insulating layer ILD3 through a contact hole penetrating the third interlayer insulating layer ILD3. Accordingly, when the first power source ELVDD is applied to the first power line PL1, the first power source ELVDD may also be applied to the shielding electrode line NE1. In an exemplary embodiment, the first reflective electrode REL1 may be connected to the shielding electrode line NE1 through a contact hole CT1 penetrating the protective layer PSV. Thus, when the first power source ELVDD is applied to the first power line PL1, the first power source ELVDD may be applied to the first reflective electrode REL1 via the shielding electrode line NE1.

For example, as illustrated in FIG. 5B, the second reflective electrode REL2 may be connected to the second power line PL2 provided on the third interlayer insulating layer ILD3 through a contact hole CT2 penetrating the protective layer PSV and the third interlayer insulating layer ILD3. Thus, when the second power source ELVSS is applied to the second power line PL2, the second power source ELVSS may also be applied to the second reflective electrode REL2.

In an exemplary embodiment, referring to FIGS. 5A, 6A, 6B, and 7, the shielding electrode line NE1 may include a first electrode part extending in a first direction DR1 and a second electrode part extending in a second direction DR2 perpendicular to the first direction DR1.

In an exemplary embodiment, the shielding electrode line NE1 may be provided under the first reflective electrode REL1 that is disposed at the outermost portion of the second pixel PXL2. The shielding electrode line NE1 may widely extend up to an adjacent first pixel PXL1 beyond the region of the second pixel PXL2. For example, the shielding electrode line NE1 may not overlap the second power line PL2 in a vertical direction V.

As described above, the shielding electrode line NE1, to which the first power source ELVDD is applied, may be disposed under a first end portion EP of a light emitting device LD. For example, the shielding electrode line NE1, which is under the first end portion EP1 of the light emitting device LD at the outermost portion of the second pixel PXL2, may extend up to another pixel (e.g., the first pixel PXL1) adjacent to the second pixel PXL2. For example, referring to FIG. 7, the shielding electrode line NE1 may be disposed under the first end portion EP1 of the light emitting device LD disposed at a left outermost portion of the second pixel PXL2. Further, the shielding electrode line (having the same shape) may be disposed under the first end portion EP1 of the light emitting device LD disposed at a right outermost portion of the second pixel PXL2.

In an exemplary embodiment, referring to FIGS. 5A and 5B, when a plurality of light emitting devices LD are aligned between the first reflective electrode REL1 and the second reflective electrode REL2, a vertical electric field effect caused by other elements, e.g., the scan line Si, and the like, which are disposed in the pixel circuit layer PCL, may be prevented by the shielding electrode line NE1. For example, the shielding electrode line NE1, which is disposed under the first end portion EP1 of a light emitting device LD at an outermost portion of a pixel PXL, may extend up to an adjacent pixel, so that a vertical electric field effect on the first electrode disposed at the outermost portion of the pixel PXL, which is caused by other elements in the pixel circuit layer PCL of the adjacent pixel, may be prevented by the extended shielding electrode line NE1. Thus, light emitting devices LD may be aligned between the first and second reflective electrodes REL1 and REL2 in a pixel region without misalignment by the shielding electrode line NE1 between the first end portion EP1 of the light emitting device LD and the other elements in the pixel circuit layer PCL in the vertical direction V. Further, the light emitting devices may be prevented from being aligned in an unwanted region beyond the pixel region, e.g., the outside of the anode electrode disposed at the outermost portion of the pixel PXL.

Further, the first power source ELVDD may be applied through the first power line PL1 and the shielding electrode line NE1. Thus, stress applied to the display device may be reduced, and a voltage drop of the first power source ELVDD may be reduced or prevented.

Referring to FIGS. 5B, 7, and 8, the display element layer DPL of each of the first and second pixels PXL1 and PXL2 may include a plurality of first and second partition walls PW1 and PW2, a plurality of first and second reflective electrodes REL1 and REL2, light emitting devices LD, and a plurality of contact electrodes CNE1 and CNE2, which are provided on the protective layer PSV.

For example, each of the light emitting devices LD may include a first end portion EP1 and a second end portion EP2 along the first direction DR1. One of first and second conductive semiconductor layers 11 and 13 may be disposed at the first end portion EP1, and another one of the first and second conductive semiconductor layers 11 and 13 may be disposed at the second end portion EP2.

In an exemplary embodiment, a first insulating layer INS1 may cover a lower surface of the light emitting device LD. A second insulating layer INS2 may cover a partial upper surface of the light emitting device LD. Both the end portions EP1 and EP2 of the light emitting device LD as regions that are not covered by the second insulating layer INS2 may be exposed to the outside.

The plurality of first and second partition walls PW1 and PW2 may be spaced apart from each other on the protective layer PSV in a horizontal direction H. The first and second partition walls PW1 and PW2 may be spaced apart from each other at a length of one light emitting device LD or more on the substrate SUB in the horizontal direction H. The first and second partition walls PW1 and PW2 may include an insulating material including, e.g., an inorganic material or organic material. The first and second partition walls PW1 and PW2 may have a trapezoidal shape of which side surface is inclined at a predetermined angle as shown in FIGS. 6A, 6B, and 7. Alternatively, the first and second partition walls PW1 and PW2 may have a semicircular shape as shown in FIG. 8. However, in some embodiments, the first and second partition walls PW1 and PW2 may have various shapes, e.g., a semi-elliptical shape, a circular shape, and a quadrangular shape.

In an exemplary embodiment, referring to FIG. 5B, the first reflective electrode REL1 may include a first stem part extending in the first direction DR1 and a plurality of first branch parts extending from the first stem part in the second direction DR2 intersecting the first direction DR1. The second reflective electrode REL2 may include a second stem part extending in the first direction DR1, and a plurality of second branch parts extending from the second stem part in the second direction DR2. The plurality of second branch parts may be alternately disposed with the plurality of first branch parts.

The first reflective electrode REL1 may be provided on the first partition wall PW1. The first reflective electrode REL1 may be disposed adjacent to one of the first and second end portions EP1 and EP2 of each light emitting device LD, and may be electrically connected to the corresponding light emitting device LD through the first contact electrode CEN1. The second reflective electrode REL2 may be provided on the second partition wall PW2. The second reflective electrode REL2 may be disposed adjacent to another one of the first and second end portions EP1 and EP2 of each light emitting device LD.

For example, one of the first and second reflective electrodes REL1 and REL2 may be an anode electrode of a light emitting device LD, and another of the first and second reflective electrodes REL1 and REL2 may be a cathode electrode of the light emitting device LD. In an exemplary embodiment, the first reflective electrode REL1 may be the anode electrode of the light emitting device LD, and the second reflective electrode REL2 may be the cathode electrode of the light emitting device LD.

The first reflective electrode REL1 and the second reflective electrode REL2 may be disposed on the same plane in the horizontal direction H, and have the same height in the vertical direction V. For example, when the reflective electrode REL1 and the second reflective electrode REL2 have the same height, the light emitting device LD may be more stably connected to the first and second reflective electrodes REL1 and REL2.

The first and second reflective electrodes REL1 and REL2 may be provided to correspond to shapes of the first and second partition walls PW1 and PW2. Thus, the first reflective electrode REL1 may have a slope corresponding to that of the first partition wall PW1, and the second reflective electrode REL2 may have a slope corresponding to that of the second partition wall PW2.

In an exemplary embodiment, the first and second reflective electrodes REL1 and REL2 may be formed of a conductive material having reflexibility. The first and second reflective electrodes REL1 and REL2 may reflect lights emitted from both the end portions EP1 and EP2 of the light emitting device LD in a direction (e.g., a front direction or the vertical direction V) in which an image is displayed. For example, as the first and second reflective electrodes REL1 and REL2 have shapes corresponding to those of the first and second partition walls PW1 and PW2, the lights emitted from both the end portions EP1 and EP2 of the light emitting device LD may be reflected by the first and second reflective electrodes REL1 and REL2, to further advance in the front direction. Thus, the efficiency of the lights emitted from the light emitting device LD may be improved. In an exemplary embodiment, the first and second partition walls PW1 and PW2, which extend along with the first and second reflective electrodes REL1 and REL2, may serve as reflective members to improve the efficiency of light emitted from each of the light emitting devices LD.

Referring to FIG. 5B, the first reflective electrode REL1 may have a bar-like shape extending along the second direction DR2 intersecting the first direction DR1. The first reflective electrode REL1 may be connected to a (1-1)th connection line CNL1_1 extending in the first direction DR1. The (1-1)th connection line CNL1_1 may be integrally provided with the first reflective electrode REL1. The (1-1)th connection line CNL1_1 may be electrically connected to a transistor through a contact hole. Thus, a signal provided to the transistor may be applied to the first reflective electrode REL1 through the (1-1)th connection line CNL1_1. In an exemplary embodiment, the (1-1)th connection line CNL1_1 may be a line that applies a voltage to the first reflective electrode REL1 when a corresponding light emitting device LD is aligned.

For example, the second reflective electrode REL2 may be connected to a (2-1)th connection line extending in the first direction DR1. The (2-1)th connection line may be integrally provided with the second reflective electrode REL2, and may extend along the first direction DR1. The (2-1)th connection line may be electrically connected to a signal line through a contact hole when the display device is driven in an active matrix manner. Thus, a voltage of the signal line may be applied to the second reflective electrode REL2 through the (2-1)th connection line. For example, when a second driving power source VSS is applied to the signal line, the second driving power source VSS may be applied to the second reflective electrode REL2 through the (2-1)th connection line. In an exemplary embodiment, the (2-1)th connection line may be a line that applies a voltage to the second reflective electrode REL2 when a corresponding light emitting device LD is aligned.

The first and second reflective electrodes REL1 and REL2 and the connection lines may be formed of a conductive material. The conductive material may include a metal, e.g., Ag, Mg, Al, Pt, Pd, Au, Ni, Nd, Ir, Cr, or any alloy thereof, a conductive oxide, e.g., indium tin oxide (ITO), indium zinc oxide (IZO), zinc oxide (ZnO), or indium tin zinc oxide (ITZO), a conductive polymer, e.g., PEDOT, and the like. Further, the first and second reflective electrodes REL1 and REL2 and the connection lines may be formed in a single layer. For example, the first and second reflective electrodes REL1 and REL2 and the connection lines may be formed in a multi-layer in which two or more materials among metals, alloys, conductive oxides, and conductive polymers are stacked. For example, the first and second reflective electrodes REL1 and REL2 and the (1-1)th and (2-1)th connection lines may be formed of a conductive material having constant reflexibility to allow lights emitted from both the end portions EP1 and EP2 of each of the light emitting devices LD to advance in a direction (e.g., a front direction) in which an image is displayed.

For example, the first contact electrode CNE1 may electrically and/or physically stably connect the first reflective electrode REL1 to one of both the end portions EP1 and EP2 of each of the light emitting devices LD. The first contact electrode CNE1 may be provided on the first reflective electrode REL1. The first contact electrode CNE1 may be formed of a transparent conductive material such that light emitted from each of the light emitting devices LD and then reflected in the front direction by the first reflective electrode REL1 may emit in the front direction. For example, the transparent conductive material may include ITO, IZO, ITZO, and the like.

When viewed on a plane, the first contact electrode CNE1 may cover the first reflective electrode REL1 and may overlap the first reflective electrode REL1. Further, the first contact electrode CNE1 may partially overlap one of both the end portions EP1 and EP2 of each light emitting device LD.

A third insulating layer INS3 may cover the first contact electrode CNE1, and may be provided over the first contact electrode CNE1. Thus, the first contact electrode CNE1 may not be exposed to the outside by the third insulating layer INS3, so that corrosion of the first contact electrode CNE1 may be prevented. The third insulating layer INS3 may be an inorganic insulating layer including, e.g., an inorganic material or an organic insulating layer including an organic material. The third insulating layer INS3 may be provided in a single layer. Further, the third insulating layer INS3 may be provided in a multi-layer. When the third insulating layer INS3 is provided in the multi-layer, the third insulating layer INS3 may have a structure in which a plurality of inorganic insulating layers and a plurality of organic insulating layers are alternately stacked. For example, the third insulating layer INS3 may have a structure in which a first inorganic insulating layer, an organic insulating layer, and a second inorganic insulating layer are sequentially stacked.

The second contact electrode CNE2 may be provided on the second reflective electrode REL2. When viewed on a plane, the second contact electrode CNE2 may cover the second reflective electrode REL2, and may overlap the second reflective electrode REL2 (in a vertical direction). Further, the second contact electrode CNE2 may overlap the second end portion EP2 of the light emitting device LD. The second contact electrode CNE2 may be formed of the same material as the first contact electrode CNE1.

For example, a fourth insulating layer INS4 may cover the second contact electrode CNE, and may be provided over the second contact electrode CNE2. Thus, the second contact electrode CNE2 may not be exposed to the outside by the fourth insulating layer INS4, so that corrosion of the second contact electrode CNE2 may be prevented. The fourth insulating layer INS4 may be formed of one of an inorganic insulating layer and an organic insulating layer.

For example, an overcoat layer OC may be provided on the fourth insulating layer INS4. The overcoat layer OC may be a planarization layer for reducing a step difference generated by the first and second partition walls PW1 and PW2, the first and second reflective electrodes REL1 and REL2, the first and second contact electrodes CNE1 and CNE2, and the like, which are disposed on the bottom thereof. Further, the overcoat layer OC may be an encapsulation layer for preventing oxygen, moisture, and the like from penetrating into the light emitting devices LD. In some embodiments, the overcoat layer OC may be omitted. When the overcoat layer OC is omitted, the fourth insulating layer INS4 may serve as an encapsulation layer for preventing oxygen, moisture, and the like from penetrating into the light emitting devices LD.

As described above, the first end portion EP1 of the light emitting device LD may be connected to the first reflective electrode REL1, and the second end portion EP2 of the light emitting device LD may be connected to the second reflective electrode REL2. For example, the first conductive semiconductor layer 11 of the light emitting device LD may be connected to the first reflective electrode REL1, and the second conductive semiconductor layer 13 of the light emitting device LD may be connected to one side of the second reflective electrode REL2. Thus, the first and second conductive semiconductor layers 11 and 13 of the light emitting device LD may be applied with a predetermined voltage through the first reflective electrode REL1 and the second reflective electrode REL2. When an electric field having a predetermined voltage or more is applied to both the end portions EP1 and EP2 of the light emitting device LD, the light emitting device LD may emit light while electron-hole pairs are being combined in the active layer 12. For example, the display element layer DPL of each of the first and second pixels PXL1 and PXL2 may further include a first capping layer CPL1 and a second capping layer CPL2.

The first capping layer CPL1 may be provided on the first reflective electrode REL1. The first capping layer CPL1 may prevent damage of the first reflective electrode REL1 due to a defect or the like, which occurs in a fabricating process of the display device, and further reinforce adhesion between the first reflective electrode REL1 and the substrate SUB. The first capping layer CPL1 may be formed of a transparent conductive material, e.g., IZO so as to minimize loss of light emitted from each of the light emitting devices LD and then reflected in the front direction by the first reflective electrode REL1.

The first capping layer CPL1 may be connected to a (1-2)th connection line CNL1_2 extending in the first direction DR1. The (1-2)th connection line CNL1_2 may be integrally provided with the first capping layer CPL1, and include the same material as the first capping layer CPL1. The (1-2)th connection line CNL1_2 may be provided on the (1-1)th connection line CNL1_1, and overlap the (1-1)th connection line CNL1_1 when viewed on a plane. The (1-1)th connection line CNL1_1 and the (1-2)th connection line CNL1_2 may constitute a first connection line CNL1 in the pixel region.

The second capping layer CPL2 may be provided on the second reflective electrode REL2. The second capping layer CPL2 may prevent damage of the second reflective electrode REL2 due to a defect or the like, which occurs in the fabricating process of the light emitting device, and further reinforce adhesion between the second reflective electrode REL2 and the substrate SUB. The second capping layer CPL2 may be provided in the same layer with the first capping layer CPL1, and include the same material as the first capping layer CPL1.

In the display device according to the present disclosure, a field effect from other elements is blocked when an ultra-small light emitting device having a nano unit size is aligned between two electrodes different from each other, so that the ultra-small light emitting device can be aligned in a desired region.

Further, in the display device according to the exemplary embodiments, reduction in Short Range Uniformity (SRU) or occurrence of a mixed color, which is caused when the ultra-small light emitting device is aligned in an unwanted region, may be prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device comprising:
a substrate; a plurality of pixels disposed on the substrate;
an electrode part including a first electrode in each pixel of the plurality of pixels on the substrate and a second electrode spaced apart from the first electrode on a same plane;
a plurality of light emitting devices spaced apart from each other between the first electrode and the second electrode;
a power line part including a first power line between the substrate and the first electrode, the first power line to receive a first driving power source, and a second power line between the substrate and the second electrode, the second power line to receive a second driving power source; and
a shielding electrode line between the power line part and the first electrode, the shielding electrode line to receive the first driving power source.

2. The display device as claimed in claim 1, wherein the shielding electrode line is between the power line part and the first electrode to prevent a vertical electric field effect caused by a driving circuit under the electrode part when the plurality of light emitting devices are aligned between the first electrode and the second electrode.

3. The display device as claimed in claim 2, wherein:
the first electrode is connected to the first driving power source via the driving circuit, and
the second electrode is connected to the second driving power source.

4. The display device as claimed in claim 2, further comprising a scan line between the substrate and the power line part, the scan line connecting the plurality of light emitting devices and the driving circuit, wherein
the scan line is under the shielding electrode line.

5. The display device as claimed in claim 2, wherein the driving circuit includes at least one transistor, wherein
the at least one transistor includes:
a semiconductor layer on the substrate, the semiconductor layer having a channel, a source electrode, and a drain electrode; and
a gate electrode on the semiconductor layer.

6. The display device as claimed in claim 5, wherein the gate electrode includes:

a first gate electrode on a gate insulating layer that is interposed between the first gate electrode and the semiconductor layer; and a second gate electrode between the first gate electrode and the power line part.

7. The display device as claimed in claim 1, wherein the shielding electrode line is between the power line part and the electrode part.

8. The display device as claimed in claim 1, wherein the shielding electrode line extends to cover a region between adjacent pixels.

9. The display device as claimed in claim 8, wherein:

the first electrode includes a first stem part extending in a first direction and a plurality of first branch parts extending from the first stem part in a second direction intersecting the first direction, and the second electrode includes a second stem part extending in the first direction, and a plurality of second branch parts extending from the second stem part in the second direction, the plurality of second branch parts being alternately disposed with the plurality of first branch parts.

10. The display device as claimed in claim 9, wherein the shielding electrode line overlaps at least one of the first branch parts of the first electrode or the second branch parts of the second electrode.

11. The display device as claimed in claim 9, wherein one of the plurality of first branch parts of the first electrode is at an outermost portion of each pixel, wherein the shielding electrode line overlaps the one of the plurality of first branch parts of the first electrode at the outermost portion of each pixel, and extends to cover a region between adjacent pixels.

12. The display device as claimed in claim 9, wherein the shielding electrode line is connected to the first power line through a contact hole.

13. The display device as claimed in claim 1, wherein the shielding electrode line and the second power line do not overlap each other in each pixel.

14. The display device as claimed in claim 1, wherein:
the first electrode is an anode electrode of each pixel, and
the second electrode is a cathode electrode of each pixel.

15. The display device as claimed in claim 14, wherein:
the first driving power source corresponds to a voltage for supplying a current to one of the first electrode and the second electrode, and
the second driving power source is applied to another one of the first electrode and the second electrode.

16. The display device as claimed in claim 1, wherein the shielding electrode line includes:
a first electrode part extending in a first direction; and
a second electrode part extending in a second direction perpendicular to the first direction.

17. A display device comprising:

a substrate; a plurality of pixels disposed on the substrate;

an electrode part including a first electrode in each pixel of the plurality of pixels on the substrate and a second electrode spaced apart from the first electrode on a same plane;

a plurality of light emitting devices spaced apart from each other between the first electrode and the second electrode;

a power line part including a first power line between the substrate and the first electrode, the first power line having a first driving power source applied thereto, and a second power line between the substrate and the second electrode, the second power line having a second driving power source applied thereto; and a shielding electrode line between the power line part and the first electrode, the shielding electrode line having the first driving power source applied thereto, wherein:

the first electrode includes a first stem part extending in a first direction and a plurality of first branch parts extending from the first stem part in a second direction intersecting the first direction, and the second electrode includes a second stem part extending in the first direction, and a plurality of second branch parts extending from the second stem part in the second direction, the plurality of second branch parts being alternately disposed with the plurality of first branch parts, and wherein the shielding electrode line includes a third stem part extending in the first direction and a plurality of third branch parts extending from the third stem part in the second direction.

18. The display device as claimed in claim 17, wherein at least some of the third branch parts overlap at least one of the first branch parts or the second branch parts.

19. The display device as claimed in claim 18, wherein one of the plurality of first branch parts is at an outermost portion of each pixel, wherein one of the third branch parts overlaps the one of the plurality of first branch parts at the outermost portion of each pixel, and extends to cover a region between adjacent pixels.

* * * * *